US006902951B2

United States Patent
Goller et al.

(10) Patent No.: US 6,902,951 B2
(45) Date of Patent: Jun. 7, 2005

(54) ELECTRONIC DEVICE CONFIGURED AS A MULTICHIP MODULE, LEADFRAME, PANEL WITH LEADFRAME POSITIONS, AND METHOD FOR PRODUCING THE ELECTRONIC DEVICE

(75) Inventors: Bernd Goller, Otterfing (DE); Robert-Christian Hagen, Sarching (DE); Christian Stuempfl, Schwandorf (DE); Stefan Wein, Lappersdorf (DE); Holger Woerner, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/696,369

(22) Filed: Oct. 29, 2003

(65) Prior Publication Data

US 2004/0140559 A1 Jul. 22, 2004

(30) Foreign Application Priority Data

Oct. 29, 2002 (DE) .......................... 102 50 538

(51) Int. Cl.⁷ .......................... H01L 21/44; H01L 21/48
(52) U.S. Cl. .......................... 438/106; 438/123; 438/124
(58) Field of Search .................. 438/106, 123–124, 438/111–112; 257/666, 700

(56) References Cited

U.S. PATENT DOCUMENTS

| 5,311,401 | A | * | 5/1994 | Gates et al. ................. 361/760 |
| 5,556,812 | A |   | 9/1996 | Leuschner et al. |
| 6,185,124 | B1 |   | 2/2001 | Buschbeck et al. |
| 6,232,655 | B1 | * | 5/2001 | Sugimura ................. 257/690 |
| 6,359,340 | B1 |   | 3/2002 | Lin et al. |
| 6,359,790 | B1 |   | 3/2002 | Meyer-Berg |
| 6,441,496 | B1 |   | 8/2002 | Chen et al. |

FOREIGN PATENT DOCUMENTS

| DE | 691 32 819 T2 | 10/1991 |
| DE | 198 47 175 A1 | 4/2000 |
| DE | 199 30 308 A1 | 1/2001 |
| EP | 0 450 950 B1 | 10/1991 |

* cited by examiner

Primary Examiner—Phat X. Cao
Assistant Examiner—Theresa T. Doan
(74) Attorney, Agent, or Firm—Laurence A. Greenberg; Werner H. Stemer; Ralph E. Locher

(57) ABSTRACT

An electronic device has, as a multichip module, two or more semiconductor chips that are integrated into a leadframe such that a placement side of the leadframe and the active top sides of the circuit chips are flush and have a common fine wiring plane. The leadframe is arranged as an expanded semiconductor chip on a rewiring substrate.

6 Claims, 2 Drawing Sheets

ELECTRONIC DEVICE CONFIGURED AS A MULTICHIP MODULE, LEADFRAME, PANEL WITH LEADFRAME POSITIONS, AND METHOD FOR PRODUCING THE ELECTRONIC DEVICE

BACKGROUND OF THE INVENTION

Field of the Invention

The invention relates to an electronic device configured as a multichip module, a leadframe arranged in the electronic device, a panel having a plurality of leadframe positions, and also to a method for producing the electronic device.

An obstacle to the increasing miniaturization of integrated circuits is the required dimensions of passive components, such as coils and capacitors, since they take up a comparatively large semiconductor chip area. Moreover, design variants and degrees of freedom of design are considerably restricted by the requirement of arranging contact areas either in the edge regions or in a respective central region of the chips. When a plurality of semiconductor chips are combined to form a module assembly, the chip design is extremely complex because of the requirement. If two semiconductor chips are intended to be wired together, then it ranges from difficult to impossible to coordinate their chip designs exactly with one another, especially if the semiconductor chips originate from different suppliers. Furthermore, it is often necessary to provide a plurality of contact areas for the supply of semiconductor chips, which necessitates additional semiconductor chip area. These disadvantages are also not overcome by the method for producing the multichip module disclosed in U.S. Pat. No. 5,556,812.

SUMMARY OF THE INVENTION

It is accordingly an object of the invention to provide an electronic device configured as a multichip module, a leadframe arranged in the electronic device, a panel having a plurality of leadframe positions, and also to a method for producing the electronic device, which overcome the above-mentioned disadvantages of the prior art apparatus and methods of this general type.

In particular, it is an object of the invention to provide an electronic device that permits more extensive miniaturization of the active top side of semiconductor chips.

With the foregoing and other objects in view there is provided, in accordance with the invention, an electronic device having two or more semiconductor chips with contact areas on their active top sides. These semiconductor chips are integrated into a leadframe in such a way that a placement side of the leadframe and the active top sides of the semiconductor chips are flush and have a common fine wiring plane. This fine wiring plane has interconnects that are so fine that it is possible to reduce the area requirement of the contact areas on the active top side of the semiconductor chip. Furthermore, the common fine wiring plane enables area-intensive passive components such as coils, capacitors, comb filters and other area-intensive components to be moved from the active top side of the semiconductor chip into the common fine wiring plane.

In the edge region of the leadframe, the fine wiring plane has contact pads that are connected via bonding connections to bonding areas of a rewiring substrate carrying the leadframe. For this purpose, the rewiring substrate has an edge region that is not covered by the leadframe. Bonding areas of the rewiring substrate are arranged on the edge region.

Since the contact areas of the semiconductor chips are connected to interconnects only in the fine wiring plane and have no areas for area-intensive bonding connections, these contact areas may be made significantly smaller than the contact pads on the leadframe and also smaller than the bonding areas on the rewiring substrate. Consequently, not only is it possible to reduce the size of the contact areas of the semiconductor chips, but they also no longer need be limited to the edge region and/or to a central bonding channel on the active top side of a semiconductor chip. Rather, it is now possible to accord the design development greater freedoms for arranging the contact areas. Consequently, the entire surface of the semiconductor chip is available for an arbitrary arrangement of miniaturized contact areas.

Arranged on the rewiring substrate is a housing, into which are packaged the components on the rewiring substrate, such as bonding wires, a leadframe with a fine wiring plane and embedded semiconductor chips. The underside of the rewiring substrate simultaneously forms an outer side of the electronic device and has external contacts of the electronic device which are distributed on the underside.

The semiconductor chips may have different sizes with regard to their thickness and their active surfaces, and also can have different integrated circuits. The differences in thickness can be leveled out by the leadframe material. Only the active top sides of the semiconductor chips have to be adapted in flush fashion to the top side of the leadframe in order to provide a prerequisite for a common fine wiring plane.

The common fine wiring plane may have electrical interconnects between the contact areas of the two or more semiconductor chips. The semiconductor chips can thus be wired together with one another via the fine wiring plane.

Furthermore, the common fine wiring plane may have electrical interconnects between the contact areas of the semiconductor chips and the contact pads in the edge region of the leadframe. In this case, it is not important that the contact areas of the semiconductor chips are arranged only in the edge region or in a central bonding region of the semiconductor chips, rather they can be distributed arbitrarily on the surface of the semiconductor chip and are nevertheless connected via the fine wiring plane to area-intensive bonding connections via the contact pads of the leadframe.

The fine wiring plane may have thin-film conductors, which are distinguished by their small thickness of a few hundred nanometers and their small width, which may likewise lie in the submicron range. It is thus possible to provide only contact areas of correspondingly miniaturized external dimensions on the semiconductor chips as well.

Furthermore, the fine wiring plane may be populated with passive discrete electronic components. Discrete components of this type may have resistors, capacitors or coils. The electrodes of which may be connected via the fine wiring plane to electrodes of the components of the integrated circuit of the semiconductor chips. In particular, it is possible to apply coils to the placement side of the leadframe, which not only cover the semiconductor chip, but are larger than the active top side of the semiconductor chip. Coils of this type may advantageously be arranged approximately half on the semiconductor chip and approximately half on the leadframe.

Furthermore, the fine wiring plane may have thin-film components, in particular electrical resistors, comb filters, inductive components and/or capacitive components. Components of this type may be realized directly with the fine wiring in the fine wiring plane. For this purpose, electrical resistors have fine wiring interconnects arranged in a meandering form, while inductive components have fine wiring interconnects arranged in a spiral form or a cochleate form. This has the advantage that it is possible to reduce the number of placement devices on the leadframe. Furthermore, it is possible to achieve larger resistances or larger inductances or capacitances than are possible on the active top sides of the semiconductor chips.

The rewiring substrate not only carries the leadframe on its top side and the external contacts of the electronic device on its underside, but has next to the bonding areas, rewiring lines and through contacts which connect the bonding areas to external contact areas. External contacts of the electronic device may be arranged on the external contact areas.

Despite the leadframe, an additional rewiring substrate for this electronic device is provided so that coarse wiring planes, that is to say rewiring lines with cross sections that correspond to the cross section of the bonding wires, are made available. The cross section of the lines differs from the fine wiring structure by about one order of magnitude.

The invention furthermore relates to a panel having a plurality of leadframe positions. Each leadframe position has a leadframe for the electronic device. The leadframe positions in the panel are arranged in rows and columns. The panel corresponds in form and size to a semiconductor wafer. This has the advantage that fine wiring structures like those that are possible when producing semiconductor chips on semiconductor wafers can also be employed for the common fine wiring plane. In this case, on the panel, not just one leadframe, but a plurality of leadframes are simultaneously provided with fine wiring structures. A panel of this type including leadframe positions can subsequently advantageously be separated into individual leadframes for electronic devices.

A method for producing an electronic device, which has a plurality of semiconductor chips that are embedded in a common leadframe, works with two different panels. First, a first panel, which has a plurality of leaframe positions, and a second panel, which has a plurality of device positions, is arranged on a rewiring plate with a plurality of rewiring substrates.

First of all, in the context of the production of an electronic device, a first panel is produced with leadframe positions arranged in rows and columns. In this case, in each leadframe position of the first panel, two or more semiconductor chips are embedded in the material of the leadframe in such a way that the active top sides of the semiconductor chips become flush with one of the two top sides of the first panel. Afterward, on this panel, a common fine wiring structure is applied to the active top sides of the semiconductor chips and to the top side of the first panel in each leadframe position. Corresponding contact pads are in the edge regions of each leadframe position. The top sides of the semiconductor chips are flush with the top side of the first panel. This first panel is then separated into individual leadframes.

Temporally independently of the production of a first panel, a rewiring plate with device positions arranged in rows and columns is produced as the baseplate of a second panel. In this case, bonding areas are arranged in edge regions of each device position, which are connected via rewiring lines and through contacts to external contact areas on the rewiring plate in each of the device positions. The leadframes separated from the first panel can then be applied to the rewiring plate in each of the device positions of the rewiring plate whilst leaving free the edge regions with bonding areas. Afterward, bonding connections are carried out between the contact pads of the leadframe and the bonding areas of the rewiring plate in each device position.

Finally, a second panel is produced by covering the device positions with a plastic housing composition. Before the panel is separated into individual electronic devices, external contacts may be provided on contact areas of the underside of the rewiring plate. However, the application of external contacts may additionally be effected for each device individually after the panel has been separated into individual electronic devices.

This method has the advantage that the individual method steps for producing an electronic device can be effected simultaneously and in parallel for a plurality of devices by producing a first and a second panel. Furthermore, the first panel may be embodied in wafer form, with the result that it is possible to carry out all the technologies for patterning a fine wiring structure by using installations, apparatus and methods that are known from silicon planar technology.

For applying a common fine wiring structure, it is possible to use a photolithography method for the fine patterning of metal closed or solid layers applied extensively and uniformly over the respective area. Photolithography methods of this type have already been developed to such an extent that submicron structures are possible for the interconnects in the common fine wiring structure.

As an alternative, for applying a fine wiring structure to the first panel or a rewiring structure to the rewiring plate, a conductive paste may be printed on and subsequently sintered to form interconnects, contact pads, bonding areas and/or passive components. A method of this type has the advantage that an unpatterned application of closed metal layers is obviated, especially since the conductive paste can be printed on in its end structure onto the leadframe or onto the rewiring plate, respectively. If the material of the contact areas that are printed on or produced by photolithography cannot directly be connected to bonding wires, then the contact areas are coated with a bondable material. On a material of this type, the bonding connections may then be produced by the thermocompression bonding of bonding wires on the contact pads.

The embedding of the leadframe with the bonding connections on the rewiring plate may also be effected before dividing the rewiring plate into individual electronic devices by using a transfer molding method, thereby producing a second panel having device positions arranged in rows and columns, which are subsequently separated out from the panel.

To summarize, it should be emphasized that the present invention realizes a leadframe with integrated semiconductor chips that can be processed further by using thin-film processes or processes comparable with those from wafer production in order to produce a fine wiring. This fine wiring enables very exact and small structures that permit connections between two chips on a confined area. The patterning makes it possible to produce installation locations and placement locations for passive components on the entire leadframe area. The fine wiring on the carrier makes it possible, finally, to route the power supply directly to the semiconductor chip. Furthermore, it is possible to reduce the housing thickness for the later components on the finished, patterned, and populated leadframe by using a grinding-back process. Via the fine wiring on the leadframe with integrated semiconductor chips, the signals are passed to the outer edge to contact pads.

After the finished patterned and populated leadframe has been mounted onto a rewiring substrate, the contact connection can be effected by wire bonding technology. In this case, all of the bonding wires are short and are situated at the edge of the leadframe. This edge position ensures that a housing can also have a high number of connections. The use of the fine wiring plane ensures that the contact pads of the leadframe are distributed uniformly between four edge side regions. The use of a leadframe with integrated semiconductor chips produces, in principle, a new chip that can be optimized with regard to the requirements of a housing.

Other features which are considered as characteristic for the invention are set forth in the appended claims.

Although the invention is illustrated and described herein as embodied in an electronic device as multichip module and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
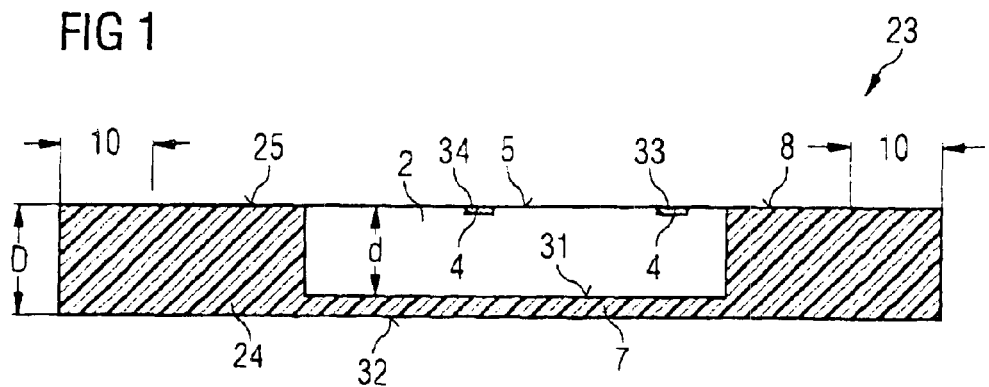
FIG. 1 is a diagrammatic cross sectional view through a leadframe position of a first panel.

Referring now to the figures of the drawing in detail and first, particularly, to FIG. 1 thereof, there is shown a diagrammatic cross sectional view through a leadframe position 23 of a first panel. This first panel essentially has a plurality of leadframe positions arranged in rows and columns. This first panel essentially corresponds in form and size to a semiconductor wafer. However, the material of this wafer is not a semiconductor plate, but rather a plastic plate, in which case, in each of the leadframe positions 23, as shown in FIG. 1, semiconductor chips 2 are integrated in such a way that the active top sides 5 of the semiconductor chips 2 terminate flush with the placement side 8 of the leadframe 7. The thickness d of the semiconductor chips 2 lies in the range of between 50 $\mu$m and 750 $\mu$m and may vary from semiconductor chip to semiconductor chip in a respective leadframe position. The thickness D of the plastic material 24 is adapted to the thickness d of the thickest of the semiconductor chips 2 within a leadframe position, so that the passive rear side 31 of the semiconductor chip 2 is covered by plastic material.

In this embodiment of FIG. 1, after the semiconductor chips 2 had been introduced into the plastic material 24, the first panel was subjected to a grinding-back process and ground down to the thickness D.

Contact areas 4 are arranged on the active top side 5 of the semiconductor chips 2. The extent of the contact areas 4 is represented to be significantly larger than the true extent of contact areas 4 of this type. It is actually smaller than contact areas on semiconductor chips that have to receive bonding wires. Consequently, the dimensions of these contact areas 4 of the semiconductor chips 2 lie in a range that is smaller than the diameter of bonding wires.

In this embodiment, the contact area 33 is arranged in the edge region of the active top side of the semiconductor chip 2, and the contact area 34 lies at an arbitrary position between the edge region and the central region of the semiconductor chip 2. Such a freely selectable arrangement of the contact area 34, which depends only on the design of the integrated circuit on the active top side 5 of the semiconductor chip 2, can be selected arbitrarily by the layout designer when designing the inventive electronic device.

Figure 2:
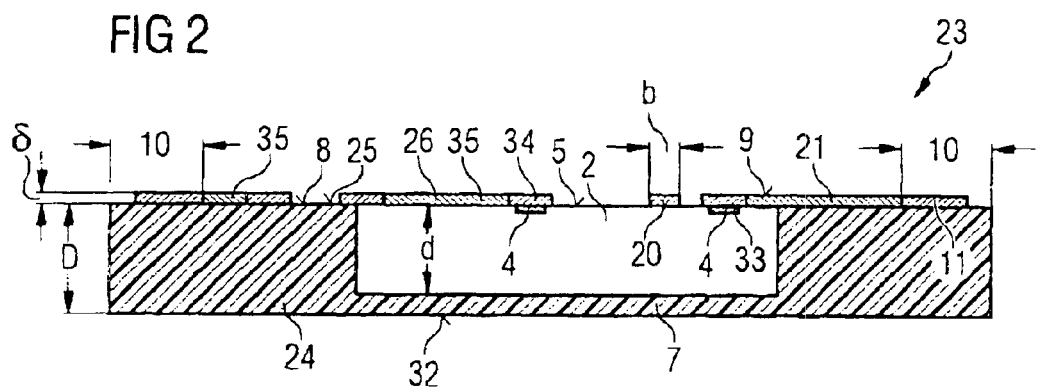
FIG. 2 is a diagrammatic cross sectional view as shown in FIG. 1, but with a fine wiring structure in the leadframe position.

The surface for realizing passive component structures and large-area contact pads for bonding connections is not limited to the surface region of the semiconductor chip 2 in this leadframe position, so that such area-intensive components of an electronic device are realized on a common fine wiring plane. Components with functions identical to those in FIG. 1 are identified using the same reference symbols in FIGS. 2 to 5 and are not discussed separately. FIG. 2 shows a diagrammatic cross sectional view as shown in FIG. 1, but with a fine wiring structure 26 in the leadframe position 23. The fine wiring structure 26 is embodied using thin-film technology and therefore has a thickness $\delta$ of between 0.5 and 2.5 $\mu$m. The width b of the interconnects 20 and 21 is of the same order of magnitude as the thickness of the fine wiring structure 26. Consequently, contact areas 4 of the same minimal order of magnitude down to the submicron range as for the width b of the interconnects 20 and 21 are possible for the semiconductor chip 2.

Contact pads 11 for corresponding bonding connections are arranged on the edge region in each leadframe position 23. These area-intensive contact pads 11 thus only take up areas which are available on the placement side 8 in each of the leadframe positions 23. While the interconnect 21 connects the contact area 33 of the semiconductor chip 2 to a contact pad 11 in the edge region 10 of the leadframe position, interconnects 20 which directly connect contact areas 4 of the semiconductor chip 2 to contact areas of adjacent semiconductor chips are also provided on the semiconductor chip 2.

Figure 3:
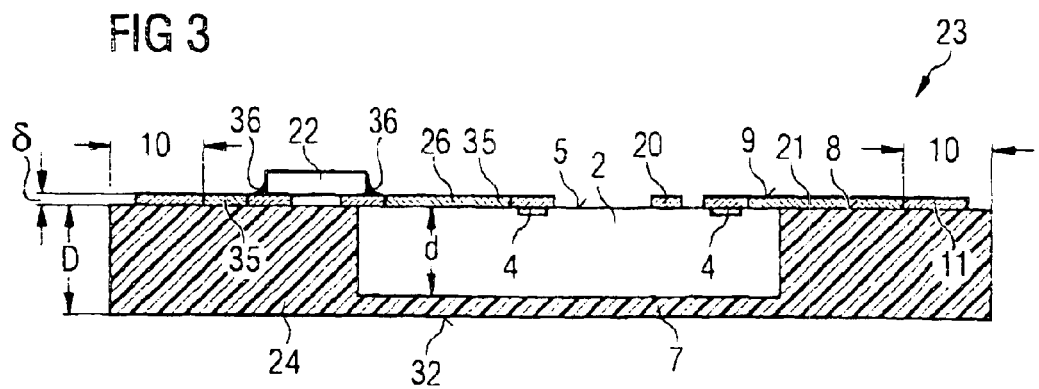
FIG. 3 is a diagrammatic cross sectional view as shown in FIG. 2, but with a discrete passive component on the fine wiring structure.

FIG. 3 is a diagrammatic cross sectional view as in FIG. 2, but with a discrete passive component 22 on the fine wiring structure 26. In this embodiment, the discrete component 22 is a capacitor. Capacitors cannot be directly formed by interconnects 20 or 21 like other passive components can be. Other passive components, such as, for example, resistors can be patterned by an arrangement of finely patterned interconnects in a meandering form, and coils can be patterned by an arrangement of the interconnects 20 and 21 in a spiral form on the fine wiring plane. In order to electrically connect a discrete component 22 in the fine wiring plane 9 within a leadframe position 23, the interconnect 35 leading from the contact area 34 to the contact pad 11 is interrupted and is bridged by the passive component 22 at the interruption location. For this purpose, the electrodes 36 of the passive component 22 are connected to ends of the interconnect 35 at the interruption location.

After the conclusion of the population of the first panel in each of the leadframe positions of the fine wiring plane 9 with passive components 22, the first panel is separated into individual leadframes of each leadframe position 23 and practically represents an enlarged chip that can be applied to a rewiring substrate.

Figure 4:
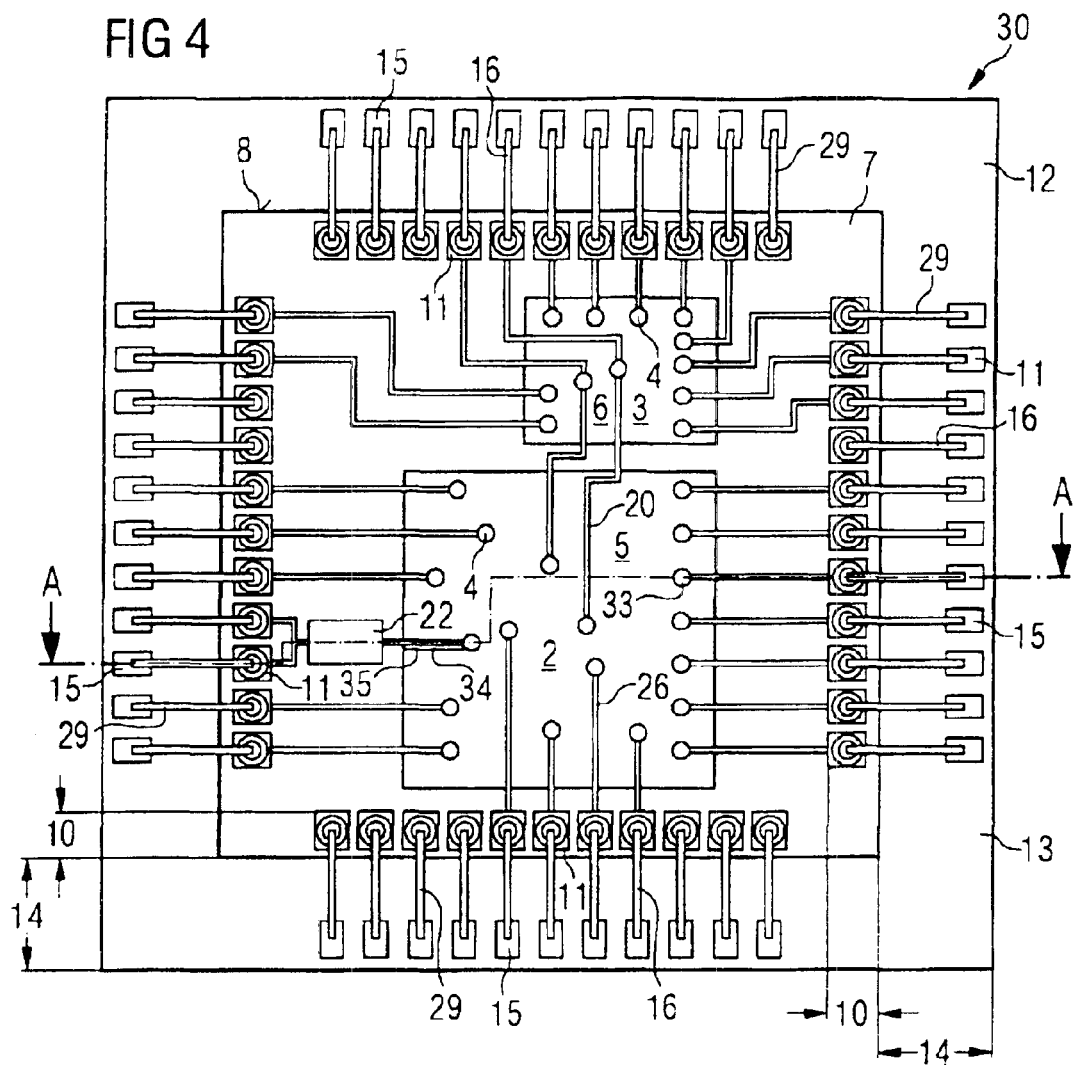
FIG. 4 is a plan view of a device position of a second panel prior to being packaged in a plastic housing composition.

FIG. 4 shows a plan view of a device position 30 of a second panel prior to packaging in a plastic housing composition. This device position 30 of the second panel has a rewiring substrate 12, which is part of a contiguous rewiring plate 27 with a plurality of device positions 30. The device positions are arranged in rows and columns in the rewiring plate. The rewiring substrate 12 carries a leadframe 7 separated from the first panel. The size of the leadframe 7 is smaller than the rewiring substrate 12. Consequently, an edge region 14 having bonding areas 15 remains free on the rewiring substrate 12. The bonding areas 15 are connected via bonding wires 29 to contact pads 11 on the leadframe 7. Rewiring lines (not shown here) proceed from the bonding areas 15 and lead, via through contacts, to the underside 19 (See FIG. 5) of the rewiring substrate 12.

The leadframe 7 shown in FIG. 4 has two semiconductor chips 2 and 3 of different sizes. The contact areas 4 of these semiconductor chips 2 and 3 are partly arranged in edge regions and partly distributed on the top sides 5 and 6 of the semiconductor chips 2 and 3. The fine wiring structure 26 has interconnects 20 which directly connect contact areas 4 of the semiconductor chip 2 to contact areas 4 of the semiconductor chip 3. Other interconnects 21 of the fine wiring structure 26 connect contact areas 4 to contact pads 11 in the edge region 10 of the leadframe 7. Further interconnects 35 of the fine wiring structure 26 connect contact areas 4 to contact pads 11 via a passive component 22.

This plan view shows that all of the area-intensive components do not take up additional active chip surface, but rather are arranged on the placement side 8 of the leadframe 7. From left to right in FIG. 4, the section line A—A runs first through the material in the edge region 14 of the rewiring substrate 12 and cuts through a bonding area 15 and a bonding wire 29 applied on a contact pad 11 of the leadframe 7 by using a thermocompression pad. From there, the section line A—A continues via the interconnect 35 through the passive component 22 to a contact area 4 that is not arranged at the edge of the semiconductor chip 2.

The section line A—A then cuts through an interconnect 20 which leads from a contact area 4 of the semiconductor chip 2 to a contact area 4 of the semiconductor chip 3. Finally, the section line A—A cuts through a contact area 4 in the edge region of the semiconductor chip 2 of the connected interconnect 21 which leads to a contact pad 11 in the edge region 10 of the leadframe 7. On the right-hand side of the device position 30, the section line A—A again cuts through a bonding wire which leads to the bonding area 15 in the edge region 14 of the rewiring substrate 12.

Figure 5:
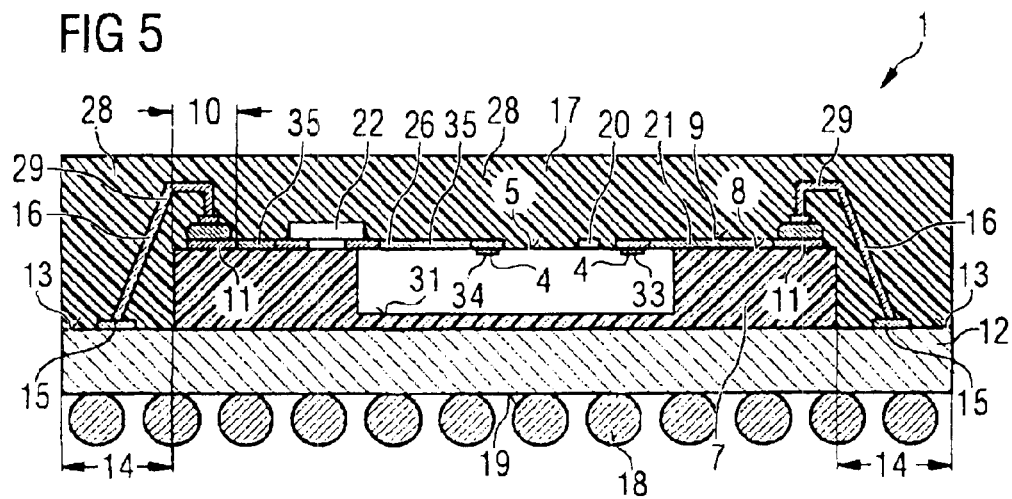
FIG. 5 is a cross sectional view of an electronic device taken along the section line A—A in FIG. 4.

FIG. 5 shows a diagrammatic cross sectional view of an electronic device 1 taken along the section line A—A of FIG. 4. FIG. 5 shows, compared with FIG. 4, that the rewiring substrate 12 is covered with a plastic housing composition 28, in which the components carried by the rewiring plate 12 are embedded. Furthermore, FIG. 5 shows external contacts 18 arranged in a manner distributed uniformly on the underside 19 of the rewiring substrate 12. These external contacts 18 are electrically connected to the bonding areas 15 on the top side 13 of the rewiring substrate 12 via external contact areas, passage contacts and rewiring lines (not shown). Consequently, in this embodiment of the invention, the contact pads 11 in the edge region 10 of the leadframe 7 are electrically connected to the external contacts 18 distributed on the underside 19 and thus on the underside of the electronic device 1.

We claim:

1. A method for producing an electronic device, the method which comprises:

producing a first panel with a plurality of leadframe positions configured in rows and columns, each one of the plurality of leadframe positions having at least two semiconductor chips embedded in a material of the first panel such that a plurality of active top sides of the semiconductor chips are flush with a top side of the first panel;

applying a common fine wiring structure to the plurality of active top sides of the semiconductor chips and to the top side of the first panel in each of the plurality of leadframe positions, and configuring a plurality of contact pads in edge regions of the plurality of leadframe positions;

separating the first panel into a plurality of individual leadframes;

producing a rewiring plate with a plurality of device positions configured in rows and columns, configuring a plurality of bonding areas in edge regions of each of the plurality of device positions, and distributing a plurality of external contact areas on an underside of the rewiring plate in each one of the plurality of the device positions;

applying a leadframe separated from the first panel in each one of the plurality of device positions of the rewiring plate while not covering the edge regions configured with the plurality of bonding areas;

producing a plurality of bonding connections between the plurality of contact pads in the edge regions of the plurality of leadframe positions and the plurality of bonding areas in the edge regions of each one of the plurality of device positions;

producing a second panel by covering the plurality of device positions with a plastic housing composition;

applying a plurality of external contacts on the plurality of external contact areas of the rewiring plate; and separating the second panel into a plurality of individual electronic devices.

2. The method according to claim 1, which further comprises:

performing the step of applying the common fine wiring structure by using a photolithography method for finely patterning uniformly applied metal layers.

3. The method according to claim 1, which further comprises:

printing on a conductive paste and subsequently sintering the paste to form structures selected from a group consisting of interconnects, contact pads, bonding areas and passive components;

the structures used for a rewiring structure of the rewiring plate or a fine wiring structure of the first panel.

4. The method according to claim 1, which further comprises:

coating the plurality of contact pads in the edge regions of the plurality of leadframe positions with a bondable material.

5. The method according to claim 1, which further comprises:

performing the step of producing the plurality of bonding connections by thermocompression bonding a plurality of bonding wires on the plurality of the bonding areas and on the plurality of contact pads.

6. The method according to claim 1, which further comprises:

performing the step of covering the plurality of device positions with a plastic housing composition by using a transfer molding method.

* * * * *